(12) United States Patent
Power et al.

(10) Patent No.: US 7,319,261 B1
(45) Date of Patent: Jan. 15, 2008

(54) INTEGRATED MOS ONE-WAY ISOLATION COUPLER AND A SEMICONDUCTOR CHIP HAVING AN INTEGRATED MOS ISOLATION ONE-WAY COUPLER LOCATED THEREON

(75) Inventors: James Anthony Power, Killaloe (IE); Michael Anthony O'Neill, Mungret (IE); Colin Gerard Lyden, Baltimore (IE)

(73) Assignee: Analog Devices, Inc., Norwood, MA (US)

( * ) Notice: Subject to any disclaimer, the term of this patent is extended or adjusted under 35 U.S.C. 154(b) by 566 days.

(21) Appl. No.: 10/721,039

(22) Filed: Nov. 21, 2003

Related U.S. Application Data

(60) Provisional application No. 60/427,993, filed on Nov. 21, 2002.

(51) Int. Cl.
*H01L 29/82* (2006.01)
(52) U.S. Cl. .................. 257/421; 257/252; 257/366
(58) Field of Classification Search ............... 257/421, 257/252, 366
See application file for complete search history.

(56) References Cited

U.S. PATENT DOCUMENTS 4,801,883 A   1/1989   Muller et al.
4,849,695 A   7/1989   Muller et al.

*Primary Examiner*—Long Pham
(74) *Attorney, Agent, or Firm*—Wolf, Greenfield & Sacks, P.C.

(57) ABSTRACT

A MOS isolation coupler is formed on a semiconductor chip by a CMOS process and comprises an inductor coil for generating a magnetic field in response to an input signal applied to terminals thereof. A MAGFET having a split drain formed by respective drain portions is formed on the semiconductor chip below the inductor coil, so that a current difference is induced between the drain currents in the drain portions which is proportional to the strength of the magnetic field generated by the inductor coil resulting from the input signal. The MAGFET is formed prior to the inductor coil. An oxide isolating layer is provided over the MAGFET, and the inductor coil is formed on the oxide layer. The depth of the oxide layer is sufficient for providing the desired amount of electrical isolation, while at the same time locating the inductor coil sufficiently close to the MAGFET so that the magnetic field generated by the inductor coil, extending axially through the inductor coil cuts the channel of the MAGFET substantially perpendicularly.

32 Claims, 5 Drawing Sheets

INTEGRATED MOS ONE-WAY ISOLATION COUPLER AND A SEMICONDUCTOR CHIP HAVING AN INTEGRATED MOS ISOLATION ONE-WAY COUPLER LOCATED THEREON

FIELD OF THE INVENTION

The present invention relates to an integrated metal oxide semiconductor (MOS) one-way isolation coupler, and in particular, to an integrated MOS isolation coupler for use on a semiconductor chip for electrically isolating an integrated circuit on the semiconductor chip from an input signal. The invention also relates to an integrated circuit chip comprising the MOS isolation coupler, and the invention relates to a method for one-way coupling an input signal to an integrated circuit on a semiconductor chip with the integrated circuit electrically isolated from the input signal.

BACKGROUND TO THE INVENTION

Isolation couplers for electrically isolating circuits, one from another are known. In general, such isolation couplers can be classified into four separate categories, namely, transformer-based isolators, capacitively coupled isolators, magneto-sensitive (e.g., Hall effect, MR, GMR and similar) isolators and opto-coupler-based isolators. Many such couplers are not suitable for use in integrated circuit applications because they require external circuit components, suffer from disadvantages relating to size and cost, and require complicated hybrid assembly or packaging arrangements. One attempt to provide an integrated magneto-sensitive isolation coupler which would to some extent be compatible with integrated circuit technology is disclosed in U.S. Pat. No. 4,801,883 of Muller, et al. The coupler of Muller, et al comprises a magnetic field source and a magnetic field detector, which are electrically isolated from each other by a dielectric medium located between the magnetic field source and the magnetic field detector. The magnetic field source is provided by a flat or planar inductor coil which receives an input signal and in turn generates a magnetic field in response to the input signal. The detector is located beneath the flat inductor coil and is provided by two carrier-domain-magnetometers which sense the magnetic field and output a signal corresponding to the input signal to the inductor coil in response to the magnetic field generated by the inductor coil. The inductor coil and the two carrier-domain-magnetometers are formed on the same integrated chip, and the carrier-domain-magnetometers are electrically isolated from the inductor coil by the dielectric medium, which is provided by a dielectric layer. However, a disadvantage of the isolation coupler of Muller, et al is that carrier-domain-magnetometers (like the field-receiving elements of many other magneto-sensitive isolators) are unsuitable for use in modern standard MOS processes. In order to implement the isolation coupler of Muller, et al in such MOS processes, substantial and costly changes and additional processing steps are required to the MOS processes. This is undesirable, since any changes or additions to standard MOS processes, and in particular to standard CMOS processes are relatively costly, and in general, introduce inefficiencies into the processes.

There is therefore a need for an integrated one-way isolation coupler which is suitable for implementation in a standard MOS process.

The present invention is directed towards providing such an integrated one-way isolation coupler. The invention is also directed towards providing a semiconductor chip comprising such a one-way isolation coupler.

SUMMARY OF THE INVENTION

According to a first aspect of the invention there is provided a MOS integrated one-way isolation coupler for use in a MOS integrated circuit on a semiconductor chip for providing an output signal in response to an input signal but electrically isolated therefrom, the isolation coupler comprising:

an inductor coil on the semiconductor chip for receiving the input signal and for generating a magnetic field in response to the input signal, the inductor coil having at least one turn and defining a central axis, a MAGFET having a split drain defining a pair of drain portions wherein the current difference between the drain currents of the respective drain portions of the split drain is a function of the magnetic field to which the MAGFET is subjected, the MAGFET being located on the semiconductor chip relative to the inductor coil so that the current difference between the drain currents of the respective drain portions of the split drain is responsive to the magnetic field generated by the inductor coil in response to the input signal for providing the output signal, and the MAGFET is electrically isolated from the inductor coil so that the output signal is electrically isolated from the input signal.

Preferably, the MAGFET is located relative to the inductor coil for providing the output signal to be proportional to the input signal.

Advantageously, the MAGFET defines a channel extending between the split drain and a source, the channel defining a channel plane, and the MAGFET is located relative to the inductor coil so that the magnetic field generated by the inductor coil in response to the input signal cuts the channel perpendicularly to the channel plane.

Preferably, the MAGFET is located relative to the inductor coil with the central axis of the inductor coil extending substantially perpendicularly to the channel plane. Ideally, the central axis of the inductor coil extends substantially centrally through the channel of the MAGFET.

In one embodiment of the invention the MAGFET is located spaced apart from an axial end of the inductor coil.

In another embodiment of the invention the MAGFET is located close to an axial end of the inductor coil.

Preferably, an electrical insulating layer is located between the MAGFET and the inductor coil for electrically isolating the MAGFET from the inductor coil. Advantageously, the electrical insulating layer is a dielectric layer. Ideally, the electrical insulating layer is selected from any one or more of the following materials:
silicon dioxide,
silicon nitride, and
polyamide.

In one embodiment of the invention the MAGFET is located beneath the inductor coil.

In another embodiment of the invention the drain of the MAGFET is split so that the current difference between the drain currents of the respective drain portions is substantially zero when no current circulates in the inductor coil.

In a further embodiment of the invention the inductor coil comprises a plurality of turns.

In one embodiment of the invention the turns of the inductor coil lie in a common plane. Alternatively, the inductor coil is formed in at least two planes, each plane containing at least one turn of the inductor coil. Preferably, the planes containing the turns of the inductor coil are parallel to each other.

Additionally, according to another aspect of the invention, there is provided a semiconductor chip comprising:

an integrated circuit formed on the semiconductor chip, a MOS integrated one-way isolation coupler on the semiconductor chip for providing an output signal to the integrated circuit in response to an input signal with the output signal electrically isolated from the input signal, the isolation coupler comprising:

an inductor coil on the semiconductor chip for receiving the input signal and for generating a magnetic field in response to the input signal, the inductor coil having at least one turn and defining a central axis, a MAGFET having a split drain defining a pair of drain portions wherein the current difference between the drain currents of the respective drain portions of the split drain is a function of the magnetic field to which the MAGFET is subjected, the MAGFET being located on the semiconductor chip relative to the inductor coil so that the current difference between the drain currents of the respective drain portions of the split drain is responsive to the magnetic field generated by the inductor coil in response to the input signal for providing the output signal, and the MAGFET is electrically isolated from the inductor coil so that the output signal is electrically isolated from the input signal.

In one embodiment of the invention an amplifier is located on the chip for amplifying the current difference between the drain currents of the respective drain portions of the split drain for providing the output signal.

ADVANTAGES OF THE INVENTION

The advantages of the invention are many. An important advantage of the invention is that it provides a MOS integrated one-way isolation coupler which is particularly suitable for implementing in conventional MOS processes, and in particular in conventional CMOS processes, without any need for modifications or additions to the MOS or CMOS process. The MAGFET can be implemented as a standard NMOS or PMOS device with a split drain, which can be readily fabricated using a conventional CMOS process. Similarly, the inductor coil can also be readily fabricated by a conventional CMOS process by depositing and etching an appropriate metal. A further advantage of the isolation coupler according to the invention is that the MAGFET is responsive to a magnetic field generated by the on-chip inductor coil which is perpendicular to the channel of the MAGFET, and thus, the MAGFET is relatively sensitive to the magnetic field, and in particular to changes in the magnetic field. A further advantage of the isolation coupler according to the invention is that by virtue of the fact that the MAGFET is responsive to a magnetic field which cuts its channel perpendicularly the MAGFET can be placed under or over the inductor coil at the center thereof, in other words, under or over the opening of the inductor coil defined by the inner turn or turns of the coil. Thus, the MAGFET can be placed in an area relative to the inductor coil where there are no metal turns of the inductor coil above or below the MAGFET, and where the magnetic field perpendicular to the inductor coil is at its strongest and most stable. Additionally, the fact that the MAGFET is located in a region which is not traversed by metal tracks of the inductor coil above or below it, further helps to minimize device asymmetry which would otherwise be introduced by overlaying or underlaying metal tracks.

Furthermore, the output signal is proportional to the input signal, and accordingly, the one-way isolation coupler is ideally suited for coupling analogue signals, as well as digital signals.

The invention and its many advantages will be more clearly understood from the following description of a preferred embodiment thereof, which is given by way of example only, with reference to the accompanying drawings.

Figure 1:
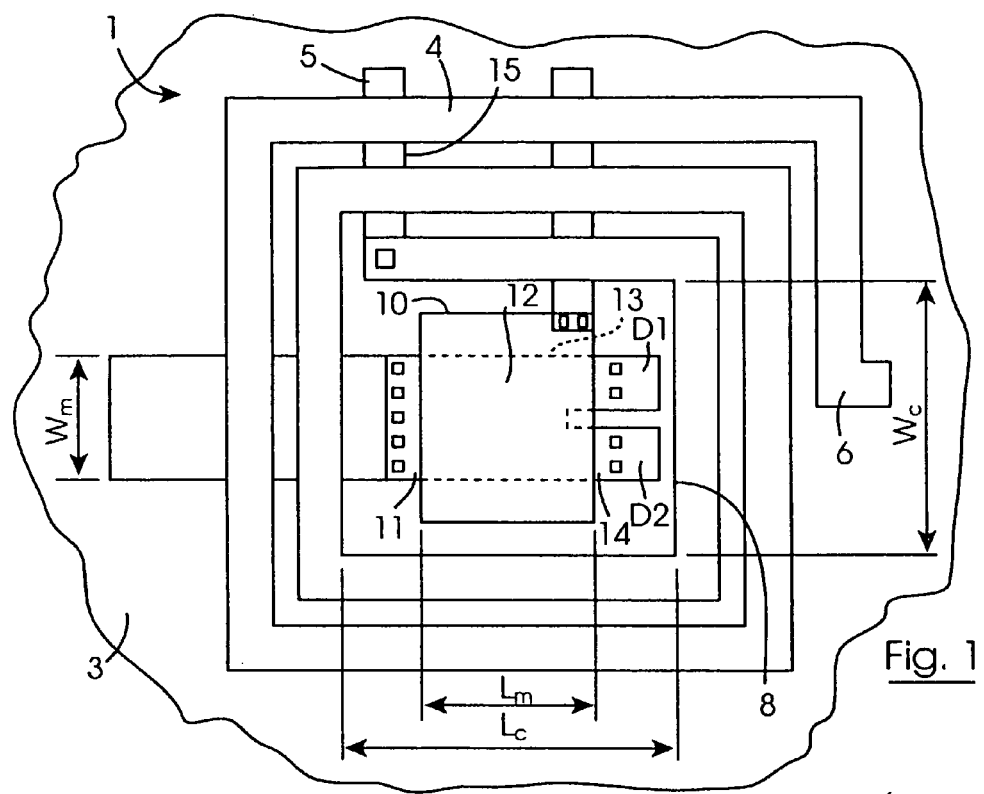
FIG. 1 is a top plan view of an integrated MOS isolation coupler according to the invention.

Referring to the drawings and initially to FIGS. 1 to 4 there is illustrated a one-way MOS integrated isolation coupler according to the invention indicated generally by the reference numeral 1 for use in supplying a signal to a MOS integrated circuit 2, both of which are formed on a semiconductor chip 3. The drawings are not to scale, and are provided for illustrative purposes only. The isolation coupler 1 outputs an output signal to the integrated circuit 2 which is proportional to an input signal applied to the isolation coupler 1. In this embodiment of the invention, the isolation coupler 1 is formed in a CMOS-compatible process, which is compatible with the CMOS process used in the formation of the integrated circuit 2. The isolation coupler 1 comprises a planar inductor coil 4 for generating a magnetic field in response to the input signal which is applied to terminals 5 and 6 of the inductor coil 4. The inductor coil 4 comprises two complete turns which are formed in a common plane on a dielectric layer, which in this embodiment of the invention is a deposited oxide isolation layer 7. The inner turn of the inductor coil 4 defines a central opening 8 and a central axis 9 of the inductor coil 4. The width of the central opening 8 is $W_c$ and the length of the central opening 8 is $L_c$.

A MAGFET 10 is provided by a split drain MOSFET which is formed on the semiconductor chip 3 beneath the oxide layer 7, and is responsive to the magnetic field generated by the inductor coil 4 for producing the output signal to the integrated circuit 2. The MAGFET 10 comprises a substrate 17, a source 11, a gate 12 and a split drain 14, which is formed by respective drain portions, namely, a drain portion D1 and a drain portion D2. A channel 13 extends between the source 11 and the split drain 14 beneath the gate 12, and is defined by the area of the gate 12. Thus, the width of the channel 13, which is the effective width of the MAGFET 10, is similar to the width of the gate 12, namely, $W_m$. The length of the channel 13, which is the effective length of the MAGFET 10, is similar to the length of the gate 12, namely, $L_m$.

Figure 2:
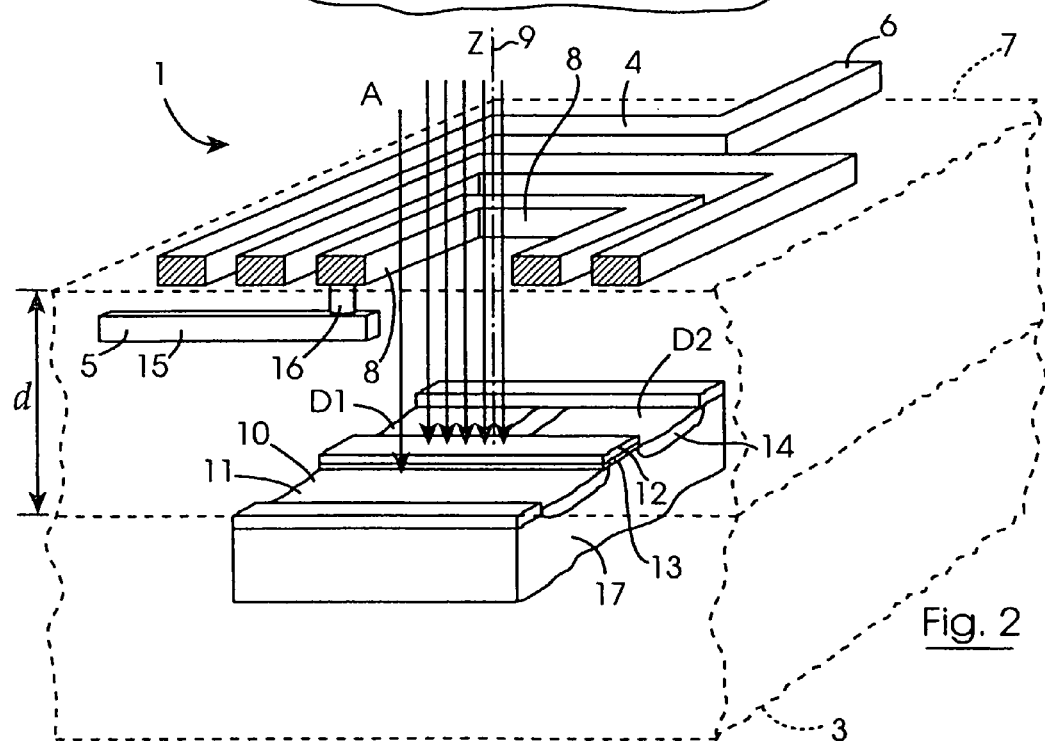
FIG. 2 is a sectional perspective view of the isolation coupler of FIG. 1.

The MAGFET 10 is located beneath, and relative to the inductor coil 4, so that when the inductor coil 4 is fabricated over the MAGFET 10, a plane defined by the channel 13 extends perpendicularly to the central axis 9 of the inductor coil 4, and the central axis 9 passes centrally through the channel 13. Thus, the MAGFET 10 and the inductor coil 4 are centrally aligned on the central axis 9, and the magnetic field generated by the inductor coil 4 along the central axis 9 cuts the channel 13 perpendicularly. In this way, the current difference $\Delta I$ of the drain currents $I_{d1}$ and $I_{d2}$ in the drain portions D1 and D2, respectively, is proportional to the strength of the magnetic field generated by the inductor coil 4 resulting from the input signal to the inductor coil 4, as will be described below. The current difference signal $\Delta I$ resulting from the difference in the drain currents $I_{d1}$ and $I_{d2}$ of the MAGFET 10 forms the input signal to the integrated circuit 2, as will be described below. In FIG. 2 the magnetic field $B_z$ generated by the inductor coil 4 perpendicular to the plane of the channel 13 of the MAGFET 10 along the central axis 9, in other words, along the Z-axis, is illustrated by the arrows A, when the plane of the channel 13 lies in an X-Y plane relative to the Z-axis.

The inductor coil 4 is spaced apart from the MAGFET 10 by the oxide layer 7, which is of depth d. The depth d of the oxide layer 7 is chosen to provide the degree of electrical isolation required between the MAGFET 10 and the inductor coil 4, but is sufficiently thin in order that the magnetic field generated by the inductor coil 4 extending axially through the centre of the inductor coil 4 cuts the channel 13 of the MAGFET 10 perpendicularly to the plane of the channel 13.

In the fabrication of the integrated circuit 2 the MAGFET 10 is formed by a conventional CMOS process. On completion of the formation of the MAGFET 10, and the associated integrated circuit 2, the oxide layer 7 is deposited over the MAGFET 10. The inductor coil 4 is then formed on the oxide layer 7 by a conventional CMOS deposition and etching process. In this embodiment of the invention the inductor coil 4 is of deposited aluminium-silicon-copper. However, since the terminal 5 is connected to the inner turn of the inductor coil 4, an electrically conductive track 15 also of a suitable deposited conductive interconnecting material extends from the terminal 5, and is formed within the oxide layer 7, and thereby is electrically isolated from the other turns of the inductor coil 4 and also from the MAGFET 10. A via (not shown) in the oxide layer 7 accommodates a conductor 16 extending between the track 15 and the inner turn of the inductor coil 4. In this embodiment of the invention the oxide layer 7 is formed as two layers. After a first of the two layers of the oxide layer 7 has been formed over the MAGFET 10, the electrically conductive track 15 is deposited on the first layer. A second layer of the oxide layer 7 is then formed over the first layer, and over the electrically conductive track 15. The via (not shown) is formed through the second layer of the oxide layer 7, and filled with aluminium to form the conductor 16. The inductor coil 4 is then deposited over the second layer of the oxide layer 7 and the inner turn of the inductor coil 4 is electrically coupled to the conductor 16 during deposition of the inductor coil 4.

Figure 4:
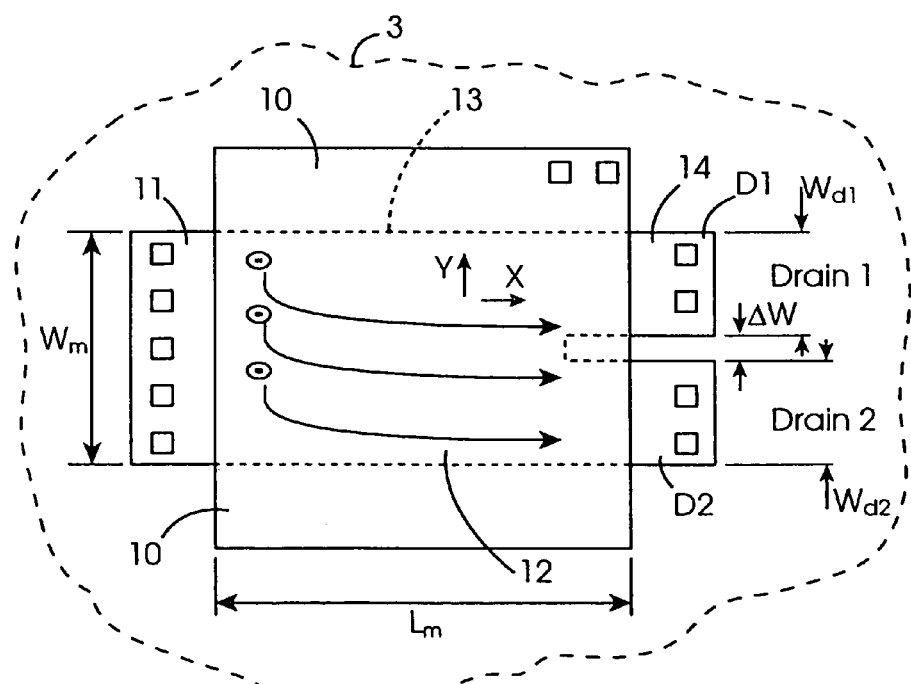
FIG. 4 is a top plan view of a portion of the isolation coupler of FIG. 1.

Referring now in particular to FIGS. 1 and 4 the MAGFET 10 will now be described in more detail. In this embodiment of the invention the MAGFET 10 is an n-channel MAGFET, and the source 11 and drain 14 are both n+, and are formed in a p substrate 17, and the gate 12 is of polysilicon. As described above, the n-channel 13 of the MAGFET 10 is of width $W_m$ and length $L_m$, see FIG. 4. The drain 14 is split to form the two drain portions D1 and D2 to be of similar width $W_{d1}$ and $W_{d2}$, so that when the MAGFET 10 is in operation, the drain currents $I_{d1}$ and $I_{d2}$ of the respective drain portions D1 and D2 are each approximately fifty percent of the total drain current in the absence of a current circulating in the inductor coil 4. In other words, in the absence of a magnetic field the drain currents $I_{d1}$ and $I_{d2}$ in the drain portions D1 and D2 are ideally equal to each other. When subjected to the magnetic field generated by the inductor coil 4, which cuts the channel 13 perpendicularly, carriers are directed towards one or other of the drain portions D1 and D2, depending on the direction of the magnetic field, under the action of a Lorentz force acting on the carriers in the channel 13 in the Y-direction, in other words, transversely of the flow of electrons in the channel 13 from the source 11 to the drain 14 in the plane of the channel 13. The Lorentz force in the Y-direction $F_y$ is given by the following equation:

$$F_y = q_e(V_x \times B_z)$$

where
   $q_e$ is the charge on the electron,
   $V_x$ is the velocity of the electron in the X-direction, in other words, in the direction of flow of electrons from the source 11 to the drain 14 parallel to the plane of the channel 13 of the MAGFET 10, and
   $B_z$ is the magnetic field strength generated by the inductor coil 4 in the Z-direction.

Accordingly, the Lorentz force $F_y$ in the Y-direction is proportional to the magnetic field strength $B_z$ acting in the Z-direction along the central axis 9.

The carrier deflection leads to a current imbalance between the drain currents in the drain portions D1 and D2, in other words, the current difference $\Delta I$ developed between the drain currents $I_{d1}$ and $I_{d2}$ in the drain portions D1 and D2. However, if the heating effect of the coil is disregarded the sum of the drain currents $I_{d1}$ and $I_{d2}$ remains unchanged. The current difference $\Delta I$ is thus proportional to the strength of the magnetic field $B_z$. Accordingly, the current difference $\Delta I$ is proportional to the total drain source current flowing through the channel 13 of the MAGFET 10 multiplied by the magnetic field strength $B_z$ perpendicular to the channel 13, since $$\Delta I = \Delta I_{d2} - \Delta I_{d1}.$$

Thus, $$\Delta I = S \cdot (I_{d1} + I_{d2}) \cdot B_z$$

where
   S is the magnetic field sensitivity of the MAGFET.

The magnetic field $B_z$ is proportional to the current $I_{coil}$ multiplied by the number of turns N of the inductor coil 4, and thus, $$\Delta I = K \cdot S \cdot (I_{d1} + I_{d2}) \cdot I_{coil} \cdot N,$$

where
   K is a constant for the isolation coupler 1.

Accordingly, the current difference $\Delta I$ is proportional to the current $I_{coil}$ flowing in the inductor coil 4.

In order to maximize the magnetic field of the inductor coil 4 to which the MAGFET 10 is subjected, the central opening 8 defined by the inner turn of the inductor coil 4 is sized such that the dimension $W_c$ is greater than or equal to the width $W_m$ of the channel 13 of the MAGFET 10, and the dimension $L_c$ is greater than or equal to the length $L_m$ of the channel 13 of the MAGFET 10. As can be seen in FIG. 1 the area of the central opening 8 is greater than the area of the channel 13 of the MAGFET 10. Additionally, the MAGFET 10 is located as close as possible to the inductor coil 4, while at the same time allowing for the required electrical isolation of the MAGFET 10 from the inductor coil 4. Accordingly, the depth of the oxide layer 7 between the MAGFET 10 and the inductor coil 4 is determined by the amount of electrical isolation required and the electrical insulating properties of the oxide layer 7.

Figure 3:
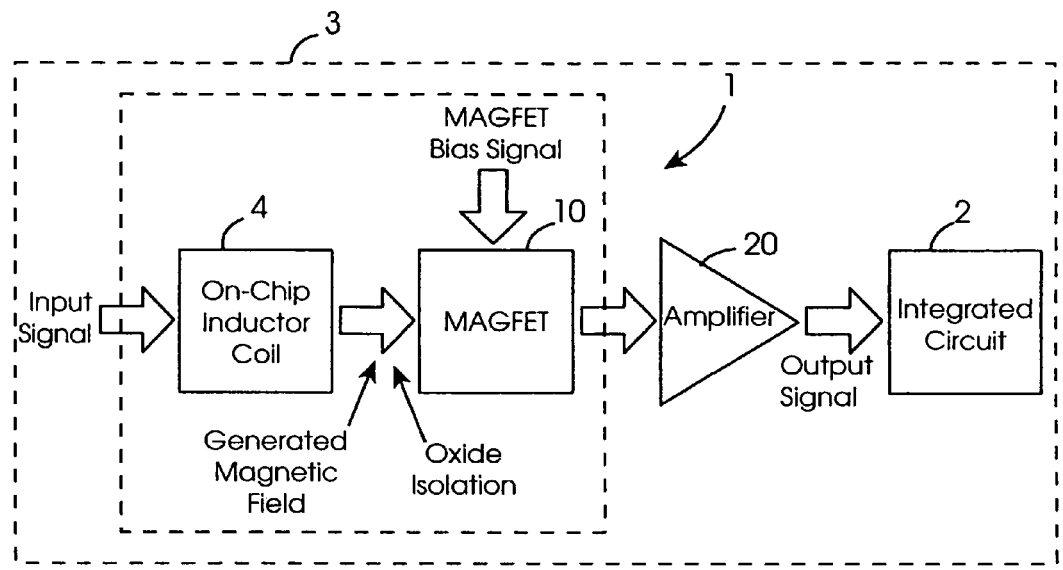
FIG. 3 is a block representation of an implementation of the isolation coupler of FIG. 1.

Referring now to FIG. 3 an implementation of the isolation coupler 1 is illustrated in block representation. In general, the current difference $\Delta I$ between the drain currents $I_{d1}$ and $I_{d2}$ of the drain portion D1 and the drain portion D2 is relatively small, and typically, is in the order of microamps. An amplifier 20 formed on the semiconductor chip 3 by the CMOS process amplifies the current difference signal $\Delta I$ prior to the current difference signal $\Delta I$ being applied to the integrated circuit 2. The amplifier 20 typically, is fabricated during fabrication of the MAGFET 10, although this will depend on the nature of the integrated circuit 2 in which the isolation coupler 1 is being implemented.

In use, the source 11 and the substrate 17 of the MAGFET 10 are grounded, and the drains D1 and D2 are biased relative to the source 11, as is the gate 12, in order to produce current flow through the drains D1 and D2. The biasing of the drain portions D1 and D2 is such as to cause the currents $I_{d1}$ and $I_{d2}$ flowing in the drain portions D1 and D2 to be ideally equal to each other in the absence of current circulating in the inductor coil 4. The input signal which may be digital or analogue is applied to the terminals 5 and 6 of the inductor coil 4 which in turn generates the magnetic field. As the strength of the magnetic field generated by the inductor coil 4 in response to the input signal varies, the current difference $\Delta I$ between the drain currents $I_{d1}$ and $I_{d2}$ of the drain portions D1 and D2 of the drain 14 of the MAGFET 10 varies in proportion to the magnetic field strength. The current difference signal $\Delta I$ resulting from the difference in the drain currents $I_{d1}$ and $I_{d2}$ is amplified by the amplifier 20 which outputs an output signal proportional to the input signal for applying to the integrated circuit 2 for further processing.

By virtue of the fact that the MAGFET 10 is electrically isolated from the inductor coil 4 the current difference $\Delta I$ signal between the drain currents of the drain portions D1 and D2 is electrically isolated from the input signal applied to the inductor coil 4, and thus, the output signal from the amplifier 20 is similarly electrically isolated from the input signal, and the integrated circuit 2 is thus electrically isolated from the circuit or circuits from which the input signal is received by the inductor coil 4.

Figure 5:
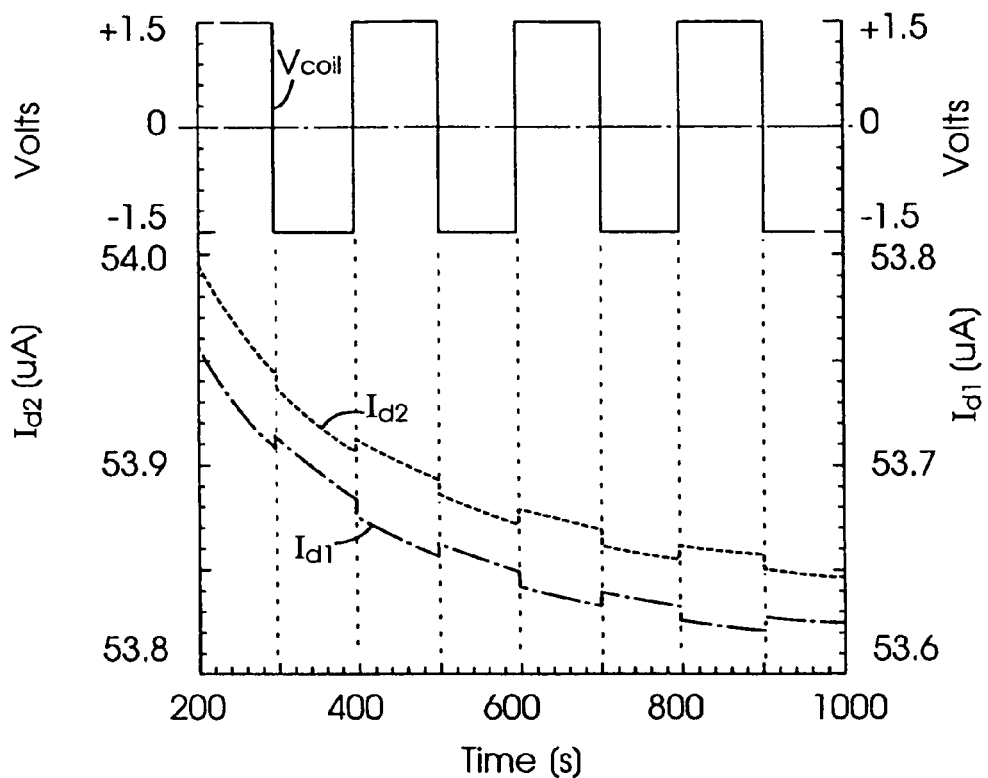
FIG. 5 is a graphical representation of signals of the isolation coupler of FIG. 1.

Referring now to FIG. 5, waveforms $I_{d1}$ and $I_{d2}$ represent the respective drain currents of the drain portions D1 and D2 resulting from a test carried out on a one-way isolation coupler 1 according to the invention. The waveform $V_{coil}$ represents the voltage of the input signal applied to the inductor coil 4 of the isolation coupler 1. The channel 13 of the MAGFET 10 of the isolation coupler 1 was of gate width $W_m$ of 40 µm, and of gate length $L_m$ of 80 µm. The inductor coil 4 comprised approximately two and a quarter turns, and defined a central opening 8 of area greater than the area of the MAGFET 10. The width of the metal of the inductor coil 4 was such as to provide the inductor coil 4 with a current carrying density sufficient to accommodate the current flowing in the inductor coil resulting from the input signal. The depth d of the oxide layer 7 between the inductor coil 4 and the MAGFET 10 was sufficiently thick to provide the desired degree of isolation between the inductor coil 4 and the MAGFET 10, while at the same time the depth d of the oxide layer 7 was sufficiently thin so that the MAGFET 10 was responsive to the magnetic field generated by the inductor coil 4. The p substrate 17 and the source 11 of the MAGFET 10 were held at zero volts, and the source gate was biased at 3 volts. The drain 14 was biased at 3 volts relative to the source 11. The input signal was a low frequency square wave of 10 mHz of 3 volts peak-to-peak varying from −1.5 volts to +1.5 volts. The time in seconds is plotted on the X-axis, and the current in microAmps is plotted on the Y-axis. The drain current $I_{d2}$ of the drain portion D2 is plotted on the left-hand Y-axis, while the drain current $I_{d1}$ of the drain portion D1 is plotted on the right-hand Y-axis. The voltage in volts of the input signal applied to the inductor coil 4, namely, $V_{coil}$ is plotted on the Y-axis.

As the input voltage signal $V_{coil}$ in the inductor coil 4 goes from high to low, and low to high the direction of the current flowing in the inductor coil 4 changes, and thus the direction of the magnetic field, which in turn alters the magnitude of the drain current $I_{d1}$ and $I_{d2}$ flowing in the respective drain portions D1 and D2. As the voltage signal $V_{coil}$ goes from high to low, the drain current $I_{d1}$ flowing in the drain portion D1 increases, while the drain current $I_{d2}$ flowing in the drain portion D2 decreases. The reverse occurs when the voltage signal $V_{coil}$ goes from low to high.

Figure 6:
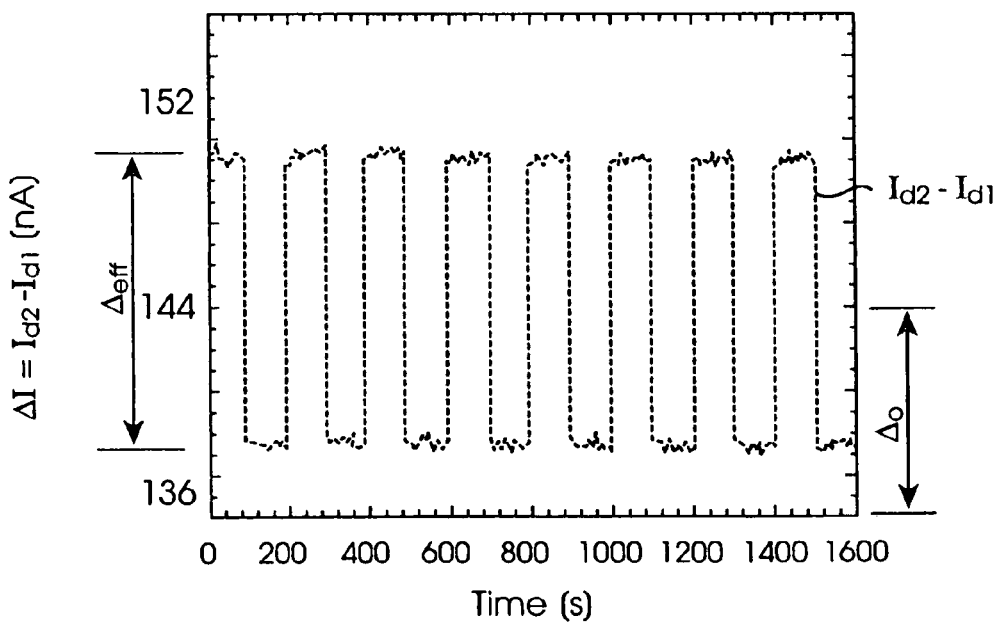
FIG. 6 is another graphical representation of signals of the isolation coupler of FIG. 1.

FIG. 6 illustrates a waveform showing the current difference $\Delta I$ of the drain currents of the drain portions D1 and D2, namely, $I_{d2}-I_{d1}$ plotted against time. The Y-axis of FIG. 6 represents current difference $\Delta I$ in nanoAmps while the X-axis represents time in seconds. In the absence of a magnetic field there is a current difference $\Delta I$ between the currents $I_{d1}$ and $I_{d2}$. This is a zero bias offset $\Delta_0$ and is due to asymmetry caused by random fluctuations in the fabrication process. In this embodiment of the invention the zero bias offset $\Delta_0$ is approximately 144 nanoAmps, while the effective maximum current difference $\Delta_{eff}$ caused by the magnetic field generated by the voltage signal $V_{coil}$, for a given voltage change in $V_{coil}$, is approximately 14 nanoAmps. The zero bias offset $\Delta_0$ is taken account of in calibration of the output of the amplifier 20. Additionally, when the low frequency input voltage signal $V_{coil}$ is initially applied to the inductor coil 4 the respective drain currents $I_{d1}$ and $I_{d2}$ decrease gradually towards a steady state value, see FIG. 5. This decrease in the respective drain currents $I_{d1}$ and $I_{d2}$ is as a result of heating of the MAGFET 10 by the coil, and also by self-heating of the MAGFET 10. However, since both the drain portions D1 and D2 are subjected to the same temperature fluctuations, the current difference $\Delta I$ remains constant irrespective of the temperature of the MAGFET, see FIG. 6.

Figure 7:
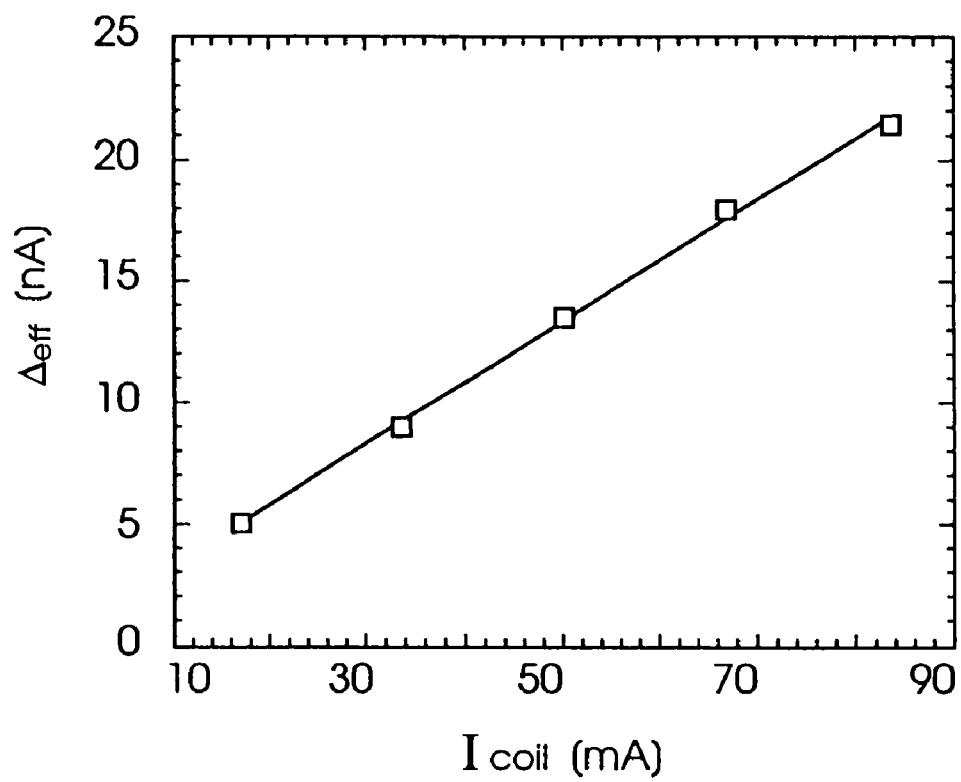
FIG. 7 is a graphical representation of signals of the isolation coupler of FIG. 1.

FIG. 7 illustrates a graph showing the magnitude of the effective maximum current difference $\Delta_{eff}$ between the drain portions D1 and D2 plotted against coil current $I_{coil}$ resulting from the input voltage signal $V_{coil}$ applied to the inductor coil 4. The voltage and the frequency of the input signal to the inductor coil 4 was similar to that described with reference to FIGS. 5 and 6, and as was the gate 12 of the MAGFET 10 was biased at 3 volts, as was the drain. The Y-axis represents the effective current difference $\Delta_{eff}$ in the drain portions D1 and D2 in nanoAmps, while the X-axis represents the coil current $I_{coil}$ in milliAmps. It can be seen that the effective maximum current difference $\Delta_{eff}$ increases linearly as the coil current $I_{coil}$ increases. Since the voltage signal $V_{coil}$ applied to the inductor coil 4 is proportional to the coil current $I_{coil}$ and the effective maximum current difference $\Delta_{eff}$, the effective maximum current difference $\Delta_{eff}$ is proportional to the coil current $I_{coil}$. Accordingly, the isolation coupler 1 according to the invention is suitable for use in analogue and digital circuits.

Figure 8:
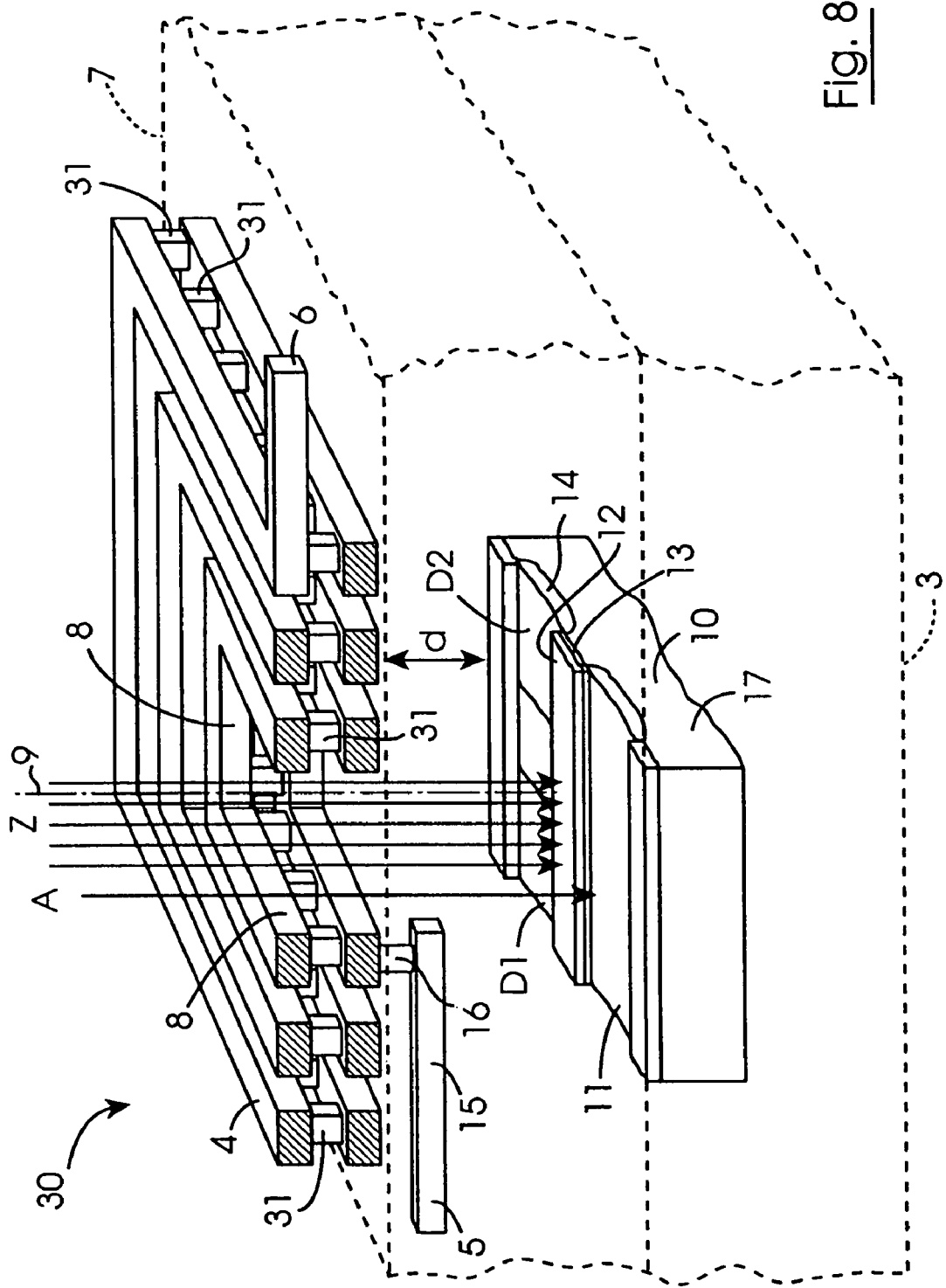
FIG. 8 is a view similar to FIG. 2 of an integrated MOS isolation coupler according to another embodiment of the invention.

Referring now to FIG. 8 there is illustrated a one-way MOS integrated isolation coupler according to another embodiment of the invention, indicated generally by the reference numeral 30. The isolation coupler 30 is substantially similar to the isolation coupler 1, and similar components are identified by the same reference numerals. The main difference between the isolation coupler 30 and the isolation coupler 1 is in the inductor coil 4. In this embodiment, the inductor coil 4 is formed in two planes, each plane containing three turns of the coil. The terminal 5 of the inductor coil 4 is coupled to the inner turn of the three turns of the inductor coil in the lower plane through the conductor 16 through a via (not shown) in the oxide layer 7, while the terminal 6 of the inductor coil is coupled to the outer turn of the three turns of the coil in the upper plane. Conductors 31 extending through vias (not shown) in the oxide layer 7 couple the corresponding turns of the coil in the respective planes at spaced apart intervals.

The fabrication of the isolation coupler 30 is substantially similar to the isolation coupler 1, with the exception that after the first three turns of the inductor coil 4 have been deposited and etched on the oxide layer 7, a further oxide layer is deposited over the three turns of the inductor coil 4 in the lower plane, and after an appropriate number of vias are formed in the oxide layer over the three turns in the lower plane, the conductors 31 are deposited in the vias. The three turns of the inductor coil 4 in the upper plane are then deposited and etched, and a further oxide layer similar to the oxide layer 7 is deposited over the three turns of the inductor coil 4 in the upper layer.

Otherwise, the isolation coupler 30 is similar to the isolation coupler 1.

While the inductor coil 4 of the isolation coupler 1 has been described as comprising only two turns, the inductor coil 4 may include any number of turns. Additionally, the inductor coil 4 may be formed in a number of layers, as is the case of the isolation coupler 30. For example, each layer of the inductor coil 4 may comprise one or more turns, and the layers of turns would be stacked one above the other on electrically isolating layers, and would be electrically connected through vias extending through the electrically isolating layers, as described with reference to the isolation coupler 30. Additionally, while the isolation coupler 30 has been described as comprising an inductor coil 4 formed in two planes, the inductor coil 4 may be formed in any number of planes. Needless to say, the greater the cross-section of the metal of the inductor coil 4, the greater will be its current carrying capacity. While the MAGFET 10 has been described as being located beneath the inductor coil 4, the MAGFET 10 may be located above the inductor coil 4, or in any suitable location so that the magnetic field generated by the inductor coil 4 cuts the plane of the channel 13 of the MAGFET 10 substantially at right angles thereto. Indeed, the MAGFET 10 may be located within the central opening 8 defined by the inner turn or turns of the inductor coil 4.

Ideally, the number of turns of the inductor coil should be as great as possible, and in particular, the area of the central opening of the inductor coil should be greater than the area of the MAGFET. However, in general, area constraints of integrated circuits will impose practical limitations on the size and area of the inductor coil. Additionally, the width of the metal of the inductor coil should be sufficient to provide the inductor coil with a current carrying density sufficient to accommodate the current which will flow in the coil resulting from the input signal. However, at the same time the width of the metal of the inductor coil should be minimised consistent with the current carrying density requirement in order to accommodate the maximum number of turns in the minimum total area occupied by the coil.

Furthermore, it is preferable that the MAGFET should lie beneath and within the area defined by the central opening of the coil.

It is envisaged that while the MAGFET has been described as being formed in a p substrate, the MAGFET could be formed in a p well. Additionally, while the MAGFET has been described as being an n-channel MAGFET, it could also be provided as a p-channel MAGFET. Additionally, while the gate of the MAGFET has been described as being of polysilicon, the gate of the MAGFET may be of any other suitable material or metal.

While the isolation couplers described with reference to the drawings have been described as being formed in a CMOS-compatible process, it will be appreciated that the isolation couplers may be formed by any suitable IC manufacturing process in which NMOS or PMOS devices can be fabricated, for example, but not limited to MOS, BiCMOS and BCDMOS processes.

It will be appreciated that a gap will be provided between the drain portions D1 and D2. The gap, which will be of width $\Delta w$ (see FIG. 4) should be chosen to be of width to optimize the magnetic field sensitivity of the MAGFET.

In view of the existence of the gap $\Delta w$ between the drain portions D1 and D2, in general, the sum of the width $W_{d1}$ and $W_{d2}$ of the drain portions D1 and D2 of the drain portions D1 and D2 will be less than the width $W_m$ of the gate, and in turn the width of the channel. The width $W_{d1}$ and $W_{d2}$ of the drain portions D1 and D2, within reason, should have little or no effect on the current flowing through the MAGFET, since this will largely be determined by the width of the channel. Once the widths $W_{d1}$ and $W_{d2}$ of the drain portions D1 and D2 are equal to each other, the drain currents flowing through the drain portions D1 and D2 should be equal to each other subject to offsets resulting from fabrication variations.

While the inductor coil 4 has been described as being deposited aluminium-silicon-copper alloy, the inductor coil 4 may be formed of any other suitable metal or alloy, for example, but not limited to aluminium-silicon alloy, copper or alloys thereof, aluminium or alloys thereof, gold or alloys thereof.

While the dielectric layer has been described as being a deposited oxide layer, the dielectric layer may be formed of any other suitable electrically insulating material, and by any other suitable process. Indeed, it is envisaged in certain cases that the dielectric layer may be provided by a thermally grown oxide layer.

While the MAGFET has been described as being biased with specific bias voltages, the MAGFET may be biased by other suitable bias voltages.

Accordingly, it will now be appreciated that only certain illustrative embodiments according to the invention have been shown and described. Various modifications and improvements to those embodiments are intended to be encompassed within the teachings of the invention and will readily occur to those skilled in the art, as will other embodiments. Accordingly, the invention is not intended to be limited by the foregoing disclosure and drawings. Rather, the invention is limited only as required by the following claims and their equivalents.

The invention claimed is:

1. A MOS integrated one-way isolation coupler for use in a MOS integrated circuit on a semiconductor chip for providing an output signal in response to an input signal but electrically isolated therefrom, the isolation coupler comprising:
an inductor coil on the semiconductor chip for receiving the input signal and for generating a magnetic field in response to the input signal, the inductor coil having at least one turn and defining a central axis,
a MAGFET having a split drain defining a pair of drain portions wherein the current difference between the drain currents of the respective drain portions of the split drain is a function of the magnetic field to which the MAGFET is subjected, the MAGFET being located on the semiconductor chip relative to the inductor coil so that the current difference between the drain currents of the respective drain portions of the split drain is responsive to the magnetic field generated by the inductor coil in response to the input signal for providing the output signal, and the MAGFET is electrically isolated from the inductor coil so that the output signal is electrically isolated from the input signal.

2. An isolation coupler as claimed in claim 1 in which the MAGFET is located relative to the inductor coil for providing the output signal to be proportional to the input signal.

3. An isolation coupler as claimed in claim 1 in which the MAGFET defines a channel extending between the split drain and a source, the channel defining a channel plane, and the MAGFET is located relative to the inductor coil so that the magnetic field generated by the inductor coil in response to the input signal cuts the channel perpendicularly to the channel plane.

4. An isolation coupler as claimed in claim 3 in which the MAGFET is located relative to the inductor coil with the central axis of the inductor coil extending substantially perpendicularly to the channel plane.

5. An isolation coupler as claimed in claim 1 in which the central axis of the inductor coil extends substantially centrally through the channel of the MAGFET.

6. An isolation coupler as claimed in claim 1 in which the MAGFET is located spaced apart from an axial end of the inductor coil.

7. An isolation coupler as claimed in claim 1 in which the MAGFET is located close to an axial end of the inductor coil.

8. An isolation coupler as claimed in claim 1 in which an electrical insulating layer is located between the MAGFET and the inductor coil for electrically isolating the MAGFET from the inductor coil.

9. An isolation coupler as claimed in claim 8 in which the electrical insulating layer is a dielectric layer.

10. An isolation coupler as claimed in claim 8 in which the electrical insulating layer is selected from any one or more of the following materials:
silicon dioxide,
silicon nitride, and
polyamide.

11. An isolation coupler as claimed in claim 1 in which the MAGFET is located beneath the inductor coil.

12. An isolation coupler as claimed in claim 1 in which the drain of the MAGFET is split so that the current difference between the drain currents of the respective drain portions is substantially zero when no current circulates in the inductor coil.

13. An isolation coupler as claimed in claim 1 in which the inductor coil comprises a plurality of turns.

14. An isolation coupler as claimed in claim 1 in which the turns of the inductor coil lie in a common plane.

15. An isolation coupler as claimed in claim 1 in which the inductor coil is formed in at least two planes, each plane containing at least one turn of the inductor coil.

16. An isolation coupler as claimed in claim 15 in which the planes containing the turns of the inductor coil are parallel to each other.

17. A semiconductor chip comprising:
an integrated circuit formed on the semiconductor chip,
a MOS integrated one-way isolation coupler on the semiconductor chip for providing an output signal to the integrated circuit in response to an input signal with the output signal electrically isolated from the input signal, the isolation coupler comprising:
an inductor coil on the semiconductor chip for receiving the input signal and for generating a magnetic field in response to the input signal, the inductor coil having at least one turn and defining a central axis,
a MAGFET having a split drain defining a pair of drain portions wherein the current difference between the drain currents of the respective drain portions of the split drain is a function of the magnetic field to which the MAGFET is subjected, the MAGFET being located on the semiconductor chip relative to the inductor coil so that the current difference between the drain currents of the respective drain portions of the split drain is responsive to the magnetic field generated by the inductor coil in response to the input signal for providing the output signal, and the MAGFET is electrically isolated from the inductor coil so that the output signal is electrically isolated from the input signal.

18. A semiconductor chip as claimed in claim 17 in which the MAGFET is located relative to the inductor coil for providing the output signal to be proportional to the input signal.

19. A semiconductor chip as claimed in claim 17 in which the MAGFET defines a channel extending between the split drain and a source, the channel defining a channel plane, and the MAGFET is located relative to the inductor coil so that the magnetic field generated by the inductor coil in response to the input signal cuts the channel perpendicularly to the channel plane.

20. A semiconductor chip as claimed in claim 19 in which the MAGFET is located relative to the inductor coil with the central axis of the inductor coil extending substantially perpendicularly to the channel plane.

21. A semiconductor chip as claimed in claim 17 in which the central axis of the inductor coil extends substantially centrally through the channel of the MAGFET.

22. A semiconductor chip as claimed in claim 17 in which the MAGFET is located spaced apart from an axial end of the inductor coil.

23. A semiconductor chip as claimed in claim 17 in which the MAGFET is located close to an axial end of the inductor coil.

24. A semiconductor chip as claimed in claim 17 in which an electrical insulating layer is located between the MAGFET and the inductor coil for electrically isolating the MAGFET from the inductor coil.

25. A semiconductor chip as claimed in claim 24 in which the electrical insulating layer is a dielectric layer.

26. A semiconductor chip as claimed in claim 17 in which the MAGFET is located beneath the inductor coil.

27. A semiconductor chip as claimed in claim 17 in which the drain of the MAGFET is split so that the current difference between the drain currents of the respective drain portions is substantially zero when no current circulates in the inductor coil.

28. A semiconductor chip as claimed in claim 17 in which the inductor coil comprises a plurality of turns.

29. A semiconductor chip as claimed in claim 17 in which the turns of the inductor coil lie in a common plane.

30. A semiconductor chip as claimed in claim 17 in which the inductor coil is formed in at least two planes, each plane containing at least one turn of the inductor coil.

31. A semiconductor chip as claimed in claim 30 in which the planes containing the turns of the inductor coil are parallel to each other.

32. A semiconductor chip as claimed in claim 17 in which an amplifier is located on the chip for amplifying the current difference between the drain currents of the respective drain portions of the split drain for providing the output signal.

* * * * *